(12) United States Patent
McLeod

(10) Patent No.: US 6,290,821 B1
(45) Date of Patent: Sep. 18, 2001

(54) SPUTTER DEPOSITION UTILIZING PULSED CATHODE AND SUBSTRATE BIAS POWER

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/533,696

(22) Filed: Mar. 23, 2000

Related U.S. Application Data

(60) Provisional application No. 60/144,355, filed on Jul. 15, 1999.

(51) Int. Cl.[7] .................................................... C23C 14/34
(52) U.S. Cl. ........................................................ 204/192.12
(58) Field of Search ........................ 204/192.12, 192.15, 204/192.16

(56) References Cited

U.S. PATENT DOCUMENTS

| | | | |
|---|---|---|---|
| 3,461,054 | 8/1969 | Vratny | 204/192 |
| 3,852,181 | 12/1974 | Cirkler et al. | 204/298 |
| 4,828,668 | 5/1989 | Yamazaki et al. | 204/298 |
| 4,902,394 | 2/1990 | Kenmotsu et al. | 204/192.12 |
| 4,963,239 | 10/1990 | Shimamura et al. | 204/192.12 |
| 4,999,096 | 3/1991 | Nihei et al. | 204/192.3 |
| 5,300,205 | 4/1994 | Fritsche | 204/192.12 |
| 5,573,597 | 11/1996 | Lantsman | 118/723 MP |
| 5,584,974 | 12/1996 | Sellers | 204/192.13 |
| 5,741,405 | 4/1998 | Statnikov et al. | 204/192.14 |
| 6,019,876 | * 2/2000 | Goedicke et al. | 204/192.2 |
| 6,086,730 | * 7/2000 | Liu et al. | 204/192.16 |

OTHER PUBLICATIONS

Edward Barnat et al., Pulsed bias magnetron sputtering of thin films on Insulators, Apr. 15, 1999, pp. 3322–3326, J. Vac. Sci. Technol. A 17(6), Nov./Dec. 1999.

* cited by examiner

*Primary Examiner*—Nam Nguyen
*Assistant Examiner*—Steven H. VerSteeg
(74) *Attorney, Agent, or Firm*—McDermott, Will & Emery

(57) ABSTRACT

A method for depositing on a substrate surface a thin film layer comprising a target material comprises providing a cathode including a target having a sputtering surface comprised of the target material, with the target sputtering surface facing the substrate surface with a space therebetween, and sputtering the target material onto the substrate surface by applying a plurality of negative voltage pulses to the cathode while simultaneously applying a bias voltage to the substrate. Embodiments include depositing thin film layers onto static or moving substrates and application of constant or time-varying substrate bias voltage. The invention finds particular utility in the formation of high purity layers in the automated manufacture of magnetic data/information storage and retrieval media.

12 Claims, 2 Drawing Sheets

SPUTTER DEPOSITION UTILIZING PULSED CATHODE AND SUBSTRATE BIAS POWER

CROSS-REFERENCE TO PROVISIONAL APPLICATION

This application claims priority from U.S. provisional patent application No. 60/144,355 filed Jul. 15, 1999, the entire disclosure of which is incorporated herein by reference.

FIELD OF THE INVENTION

The present invention relates to a method for performing high-rate cathode sputtering of a target material for obtaining high purity thin film layers on substrate surfaces. More particularly, the invention relates to a method for performing high-rate sputter deposition onto static or moving substrates to obtain high purity thin film layers having desired physical, chemical, and/or mechanical properties. The invention has particular utility in the manufacture of magnetic recording media comprising a layer stack or laminate of a plurality of overlying layers.

BACKGROUND OF THE INVENTION

Magnetic recording media are widely employed in various applications, particularly in the computer industry for data/information storage and retrieval purposes. A conventional, single-sided, longitudinal magnetic recording medium 1 in e.g., disk form, such as utilized in computer-related applications, is schematically depicted in FIG. 1 and comprises a non-magnetic substrate 10, e.g., of glass, ceramic, glass-ceramic composite, polymer, metal, metal-ceramic composite, or metal alloy, typically an aluminum (Al)-based alloy such as aluminum-magnesium (Al—Mg), having at least one major surface 10A on which a layer stack comprising a plurality of thin film layers constituting the medium are sequentially deposited. Such layers typically include a plating layer 11, as of amorphous nickel-phosphorus (NiP), a polycrystalline interlayer 12, typically of chromium (Cr) or a Cr-based alloy, a magnetic recording layer 13, e.g., of a cobalt (Co)-based alloy, a protective overcoat layer 14, typically containing carbon (C), e.g., a diamond-like carbon (DLC), and a lubricant topcoat layer 15, typically of a perfluoropolyether compound.

According to conventional manufacturing methodology, a majority of the above-described layers constituting magnetic recording medium 1 are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be formed. Each cathode comprising a selected target material can be positioned in a separate, independent process chamber, in a respective process chamber located within a larger chamber, or in one of a plurality of separate, interconnected process chambers each dedicated for deposition of a particular layer. According to such conventional manufacturing technology, media substrates, e.g., disks, are serially transported, in linear or circular fashion, depending upon the physical configuration of the particular apparatus utilized, from one sputtering target and/or process chamber to another for sputter deposition of a selected layer thereon. In some instances, again depending upon the particular apparatus utilized, sputter deposition of the selected layer commences only when the substrate (e.g., disk) deposition surface is positioned in complete opposition to the sputtering target, e.g., after the disk has fully entered the respective process chamber or area in its transit from a preceding process chamber or area, and is at rest. Stated differently, sputter deposition commences and continues for a predetermined interval only when the substrate is not in motion, i.e., deposition occurs onto static substrates. In other instances, however, substrate motion between adjoining process chambers or areas is continuous, and sputter deposition of each selected target material occurs onto moving substrates as the substrates pass by the particular cathode/target assembly.

Regardless of which type sputtering apparatus is employed for forming the thin layer stacks constituting the magnetic recording medium, it is essential for obtaining high recording density, high quality media that each of the component layers be deposited in a highly pure form. Film purity depends, inter alia, upon the purity of the atmosphere in which the film is grown; hence films are grown in as low a vacuum as is practicable. If the growth rate is maintained constant, purity can therefore be increased by more effective pumping away of contaminant gases which enter the process chamber, either by outgassing or desorption from the chamber walls and other system components, permeation into the chamber through seals such as O-rings, or as impurities in the sputter gas, e.g., argon (Ar). Alternatively, increased film purity can be obtained by increasing the rate of growth to decrease the ratio of impurity atoms in the film to those of the intended deposit.

However, practical limitations exist with respect to increasing the deposition speed obtainable with conventional sputtering apparatus and manufacturing technology, whether the deposition is performed onto static or moving substrates. For example, the available technology imposes certain limits on the output of RF and DC sputter power supplies and transport speed of the substrates from one process chamber to another (via air-locks, etc.). More specifically, available technology cannot provide more than about a ten-fold ("10x") increase in sputtering power and more than about a three-fold ("3x") increase in transport speed. Moreover, since in a moving substrate process/apparatus, a 10x increase in deposition rate requires a corresponding 10x in transport speed past the target sputtering surface in order to maintain the produced film thickness constant at the desired or target value, it becomes apparent that the requisite increase in transport speed becomes the limiting factor in obtaining higher deposition rates on moving substrates. Since only an about 3x increase in transport speed is practically possible, it is evident that only a modest improvement in film purity is possible by increasing the sputtering power applied to the target.

In addition to the above-described need for deposition rates of high purity layers consistent with the productivity requirements imposed by automated manufacturing technology, it is also essential that each of the deposited films exhibit respective physical, chemical, and/or mechanical properties, including, inter alia, proper crystal morphology necessary for high recording density media, e.g., polycrystallinity; good magnetic properties, e.g., coercivity and squareness ratio; chemical stability, e.g., inertness or corrosion resistance; and good tribological properties, e.g., wear resistance and low stiction/friction.

Accordingly, there exists a need for improved methodology for forming, by sputtering techniques, thin film layers of high purity and desired physical, chemical, and/or mechanical properties, which methodology provides for rapid, simple, and cost-effective formation of thin film layers suitable for use in the manufacture of magnetic recording media comprising a plurality of stacked layers deposited on a suitable substrate surface.

The present invention addresses and solves problems attendant upon the use of sputtering techniques for obtaining high purity thin film layers having requisite properties, such as are utilized, inter alia, in the manufacture of high recording density magnetic recording media, while maintaining full compatibility with all aspects of conventional automated manufacturing technology. Further, the methodology provided by the present invention enjoys diverse utility in the manufacture of a variety of devices and products requiring high purity thin film coating layers having desirable physical, chemical, and/or mechanical properties.

Disclosure of the Invention

An advantage of the present invention is an improved method for sputter depositing high purity thin film layers onto a substrate deposition surface.

Another advantage of the present invention is an improved method for sputter depositing high purity thin film layers having desired physical, chemical, and/or mechanical properties onto a substrate deposition surface.

Yet another advantage of the present invention is an improved method for sputter depositing high purity thin films having desired properties onto a static or moving deposition surface of a substrate.

Still another advantage of the present invention is an improved method for sputter depositing a layer stack comprising a magnetic recording medium.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of sputter depositing onto a substrate deposition surface a thin film layer comprising a target material, comprising:

(a) providing a substrate having a deposition surface;

(b) providing a cathode including a target having a sputtering surface comprised of the target material, with the target sputtering surface facing the substrate deposition surface with a space therebetween; and (c) sputtering said target material onto the substrate deposition surface by applying a plurality of negative voltage pulses to the cathode while simultaneously applying a bias voltage to the substrate.

According to an embodiment of the present invention, step (a) comprises providing a static substrate and step (c) comprises applying to the cathode a sufficient number of negative voltage pulses of sufficient power to sputter deposit a layer of desired thickness on the substrate deposition surface.

According to further embodiments of the present invention, step (c) comprises applying a constant bias voltage to the substrate, i.e., a constant positive or negative bias voltage; whereas according to still further embodiments of the present invention, step (c) comprises applying a pulsed bias voltage to the substrate synchronously with the negative voltage pulses applied to the cathode, i.e., a pulsed positive or negative bias voltage.

According to yet further embodiments of the present invention, step (c) comprises applying to the substrate first bias voltage pulses during the application of the negative voltage pulses to the cathode and applying to the substrate second, different bias voltage pulses during intervals when the negative voltage pulses are not applied to the cathode, e.g., applying to the substrate first and second bias voltage pulses which differ in voltage and/or polarity.

According to specific embodiments of the present invention, step (a) comprises providing a substrate for a magnetic recording medium and steps (b) and (c) are repeated with different target materials to deposit on the substrate deposition surface a layer stack comprising the magnetic recording medium.

According to another embodiment of the present invention, step (a) comprises providing a substrate wherein the deposition surface thereof moves past the target sputtering surface and step (c) comprises applying to the cathode a sufficient number of negative voltage pulses of sufficient power to sputter deposit a layer of desired thickness on the substrate deposition surface during the interval when the substrate deposition surface moves past the target sputtering surface.

According to further embodiments of the present invention, step (c) comprises applying a constant bias voltage to the substrate, i.e., a constant positive or negative bias voltage; whereas, according to still further embodiments of the present invention, step (c) comprises applying a pulsed positive or negative bias voltage to the substrate synchronously with the negative voltage pulses applied to the cathode.

According to yet further embodiments of the present invention, step (c) comprises applying to the substrate first bias voltage pulses during the application of the negative voltage pulses to the cathode and applying to the substrate second, different bias voltage pulses during intervals when the negative voltage pulses are not applied to the cathode, e.g., applying to the substrate first and second bias voltage pulses which differ in voltage and/or polarity.

According to specific embodiments of the present invention:

step (a) comprises providing a substrate for a magnetic recording medium, and the method further comprises:

(d) providing a plurality of cathodes each including a target having a sputtering surface comprised of a material to be sputter deposited onto the substrate deposition surface;

(e) moving the substrate deposition surface along a path passing by each of the sputtering surfaces; and (f) sputtering each of the target materials onto the substrate deposition surface by applying a plurality of negative voltage pulses to each of the plurality of cathodes while simultaneously applying a bias voltage to the substrate, thereby depositing on the substrate deposition surface a layer stack comprising the recording medium.

According to further specific embodiments of the present invention, step (f) comprises depositing a layer stack including, in sequence from the substrate deposition surface, a polycrystalline underlayer, a magnetic recording layer, and a protective overcoat layer.

According to another aspect of the present invention, a method of sputter depositing a layer of a material on a substrate surface comprises:

(a) providing a substrate having a deposition surface; and (b) sputter depositing the layer of material on the substrate deposition surface utilizing a sputter deposition apparatus including means for applying negative voltage pulses to a cathode target comprised of the material while simultaneously applying a bias voltage to the substrate.

According to a specific embodiment of the present invention, step (a) comprises providing a substrate for a magnetic recording medium.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, wherein.

DESCRIPTION OF THE INVENTION

The present invention is based upon the recognition that the above-described limitations/restrictions imposed upon high rate deposition of high purity thin film layers onto static or moving substrates by, e.g., power supply output and substrate transport speed considerations, can be avoided by delivering to the respective cathode/sputtering target assemblies high-power, negative polarity pulses of limited duration to effect target sputtering such that the average deposition rate of the respective thin film remains close to that utilized in conventional sputter deposition processing. According to the invention, a sufficient number of negative polarity pulses of a preselected power level is applied to each of the cathode/target assemblies to sputter deposit on the substrate respective thin film layers of desired or requisite thicknesses. An advantage provided by the inventive methodology is that, in the case of deposition onto moving substrates, the line speed of substrate transport can remain the same as in conventional processing, thereby overcoming the restriction on increase in the transport speed imposed by available multi-layer sputtering apparatus/technology. An essential feature of the present invention is the application of a respective bias voltage of positive or negative polarity to each of the substrates simultaneous with the supply of the negative polarity pulses to the respective cathode/target assembly, in order to provide the deposited films with desired physical, chemical, and/or mechanical properties for obtaining, e.g., a high recording density, stable, and abrasion-resistant magnetic data/information storage and retrieval medium. The respective bias voltage (i.e., of positive or negative polarity) applied to the substrate when the substrate receives a particular thin film deposit can be constant during the deposition interval, or alternatively, a pulsed bias voltage of either polarity can be applied synchronously with the negative polarity pulses applied to the associated cathode/target assembly. The pulsed bias voltage applied to the substrate can have a first voltage and/or polarity when the negative polarity voltage pulses are applied to the cathode/target assembly and a second, different, voltage and/or polarity during intervals when the negative voltage pulses are not applied to the cathode/target assembly.

Figure 1:
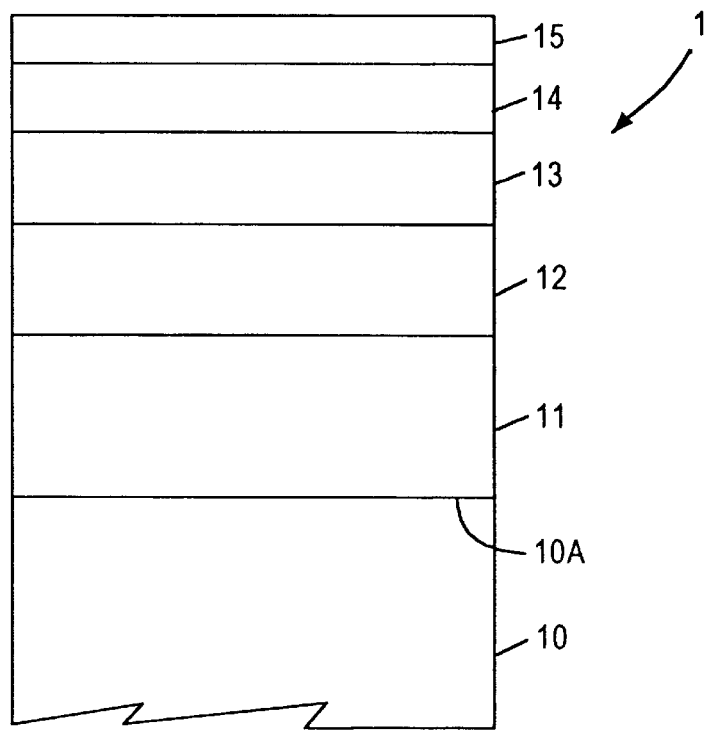
FIG. 1 schematically illustrates, in simplified cross-sectional view, a portion of a conventional longitudinal magnetic recording medium.
Figure 2:
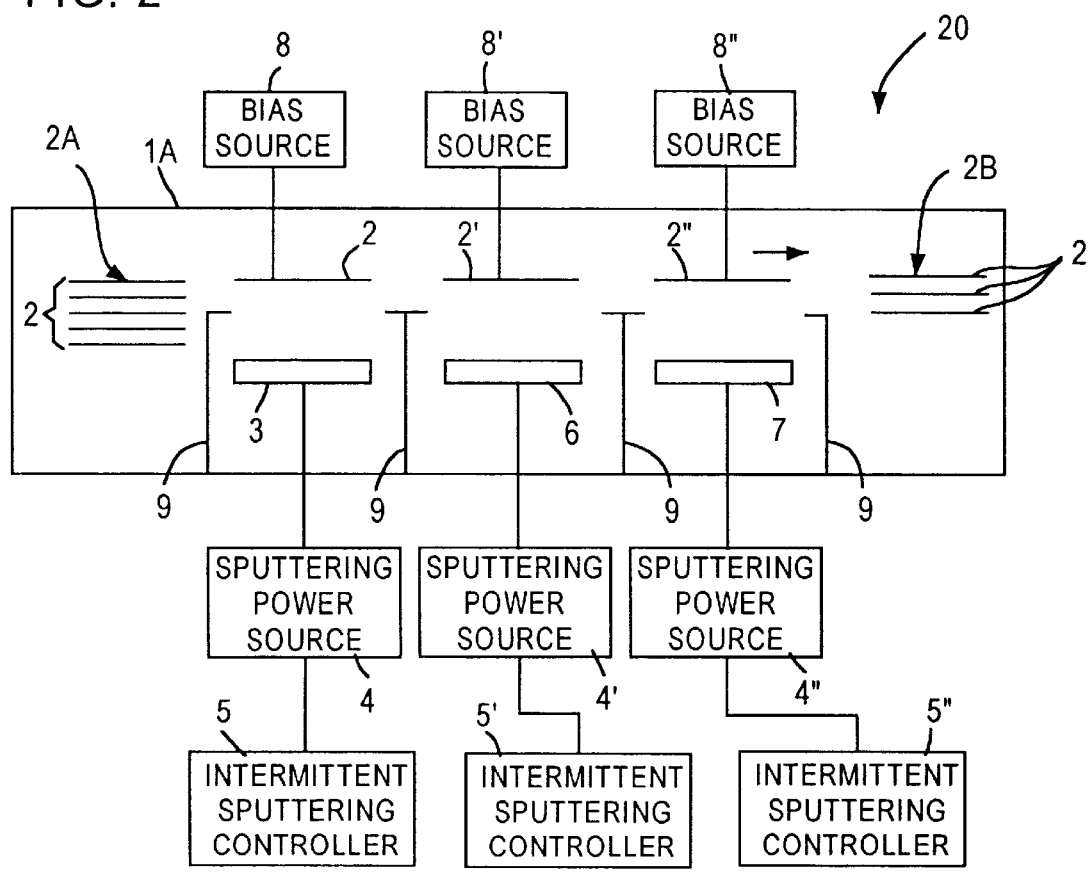
FIG. 2 schematically illustrates, in simplified cross-sectional view, an example of a sputtering apparatus adapted for performing pulsed cathode sputter deposition with simultaneous substrate bias according to the present invention.

FIG. 2 schematically illustrates, in simplified cross-sectional view, a non-limitative example of a sputtering apparatus 20 adapted for performing pulsed cathode sputter deposition with substrate bias according to the present invention. As shown, apparatus 20 comprises a single process (i.e., vacuum) chamber 1A having magazines or pallets 2A, 2B at opposite ends thereof for respectively supplying and taking up a plurality of substrates 2 (e.g., disks for magnetic media such as utilized in hard drives) which are transported, in sequence, past a plurality of sputtering target/cathode assemblies. By way of illustration but not limitation, three (3) substrates 2,2', and 2" are shown as moving (in the direction of the arrow) past three (3) deposition stations each including sputtering target/cathode assemblies 3, 6, and 7 each comprised of a selected target material. For example, in an application such as manufacture of the magnetic recording medium 1 illustrated in FIG. 1, the three (3) illustrated deposition stations including target/cathode assemblies 3, 6, and 7 may be utilized for successive deposition of a polycrystalline, Cr-based underlayer 12, a Co-based magnetic recording layer 13, and a diamond-like carbon-based protective overcoat layer 14. An additional deposition station including a sputtering target/cathode assembly can, if desired, be positioned upstream of target/cathode assembly 3 for deposition of an amorphous NiP plating layer 11 on surface 10A of substrate 10 prior to deposition of layers 12–14. Each of the sputtering target/cathode assemblies 3, 6, and 7 is supplied with pulsed, i.e., intermittent, sputtering power of negative polarity via a respective sputtering power source and associated intermittent sputtering controller 4/5, 4'/5', 4"/5" (an equivalently performing pulsed power source 4, 4', 4" may also be utilized). A respective programmable, variable substrate bias power source 8, 8', 8" is provided for supplying a desired substrate bias voltage/power profile or waveform at each of the deposition stations and vertically arranged baffles or shields 9 are provided at each of the target/cathode assemblies 3, 6, and 7 for limiting the trajectories of particles sputtered from each of the targets to the space enclosed thereby, thus preventing, or at least substantially reducing, cross-contamination of the deposited films. Cross-contamination may be further reduced by vertically extending the baffles or shields 9 to subdivide process chamber 1A into a plurality of smaller chambers each equipped with airlocks at opposite ends defined by the baffle or shield walls. A further alternative apparatus comprises an arrangement wherein a plurality of independent process chambers each dedicated for deposition of a particular layer are interconnected, as by airlocks, and the substrates are transported, in sequence, from chamber to chamber for deposition of the particular layer thereon. Yet another alternative apparatus useful for simultaneously sputter depositing the same layers on both sides of the substrates 2, 2', 2" comprises a second set of target/cathode assemblies corresponding to target/cathode assemblies 3, 6, 7 and positioned in opposition thereto. Finally, the substrate supply and take-up magazines or pallets 2A, 2B can, if desired, be located separately from the process chamber(s) and connected thereto by an airlock arrangement.

Regardless of the particular arrangement or apparatus utilized, substrate motion past the various sputtering target/cathode assemblies 3, 6, 7, etc., for deposition of the various layers thereon can be intermittent, i.e., deposition is performed onto static substrates, or continuous, i.e., deposition occurs onto moving substrates. In either case, at each deposition station comprising a sputtering target/cathode assembly 3, 6, 7, etc., the thickness of the deposited film is controlled by selecting the appropriate number and sputtering power of each of the negative polarity pulses supplied by the sputtering power source 4, 4', 4"+intermittent sputtering controller 5, 5', 5" (or equivalent) in relation to the deposition interval during which the substrates 2, 2', 2" are positioned above a target/cathode assembly, whether statically or moving past the target/cathode assembly. Stated differently, the deposited film thickness at each deposition station corresponds to the integrated value of the sputtering power supplied to the cathode/target assembly during the deposition interval. The bias voltage level/power, polarity, and waveform applied to the substrate at each deposition station are individually controllably set by the associated programmable, variable bias power sources 8, 8', 8", etc.

The substrate bias applied to the growing films as they are deposited on the substrate 2 surface can, depending upon the particular film and the type of bias applied during the negative polarity pulsing of the cathode/target assemblies, provide the film with a desired property or characteristic. For example, application of a negative substrate bias can induce a crystalline morphology wherein polycrystals of a certain grain size, e.g., of the Cr-based underlayer 12 of the magnetic recording medium 10 shown in FIG. 1 are formed as a result of bombardment of the growing film with heavy sputtering gas ions, for example, argon (Ar) ions. In addition, the continuous application of a negative polarity substrate bias with resultant bombardment of the growing surface with heavy Ar sputtering gas ions maintains a cleaner substrate surface during deposition, resulting in higher purity films. As another example illustrating the versatility of the inventive methodology, particularly as applied to the manufacture of magnetic recording media, application of a positive polarity substrate bias during a reactive sputtering process such as involving growth of the diamond-like carbon (DLC) overcoat layer 14 can increase the reaction rate between the carbon (C) atoms and the other film constituents, such as hydrogen (H), nitrogen (N), and fluorine (F), or increase crosslinking, thereby leading to improved tribological properties of paramount importance in hard drive applications, such as increased wear resistance.

Figure 3:
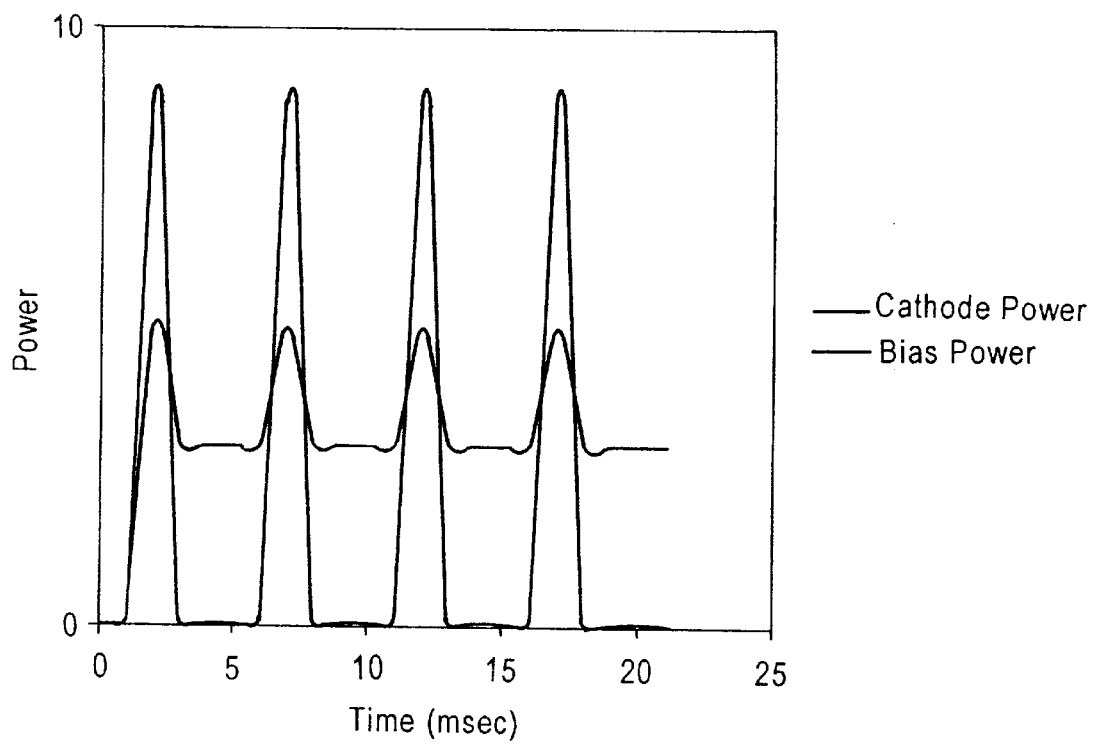
FIGS. 3–4 are graphs for illustrating cathode/substrate bias voltage-time profiles suitable for use according to the present invention.
Figure 4:
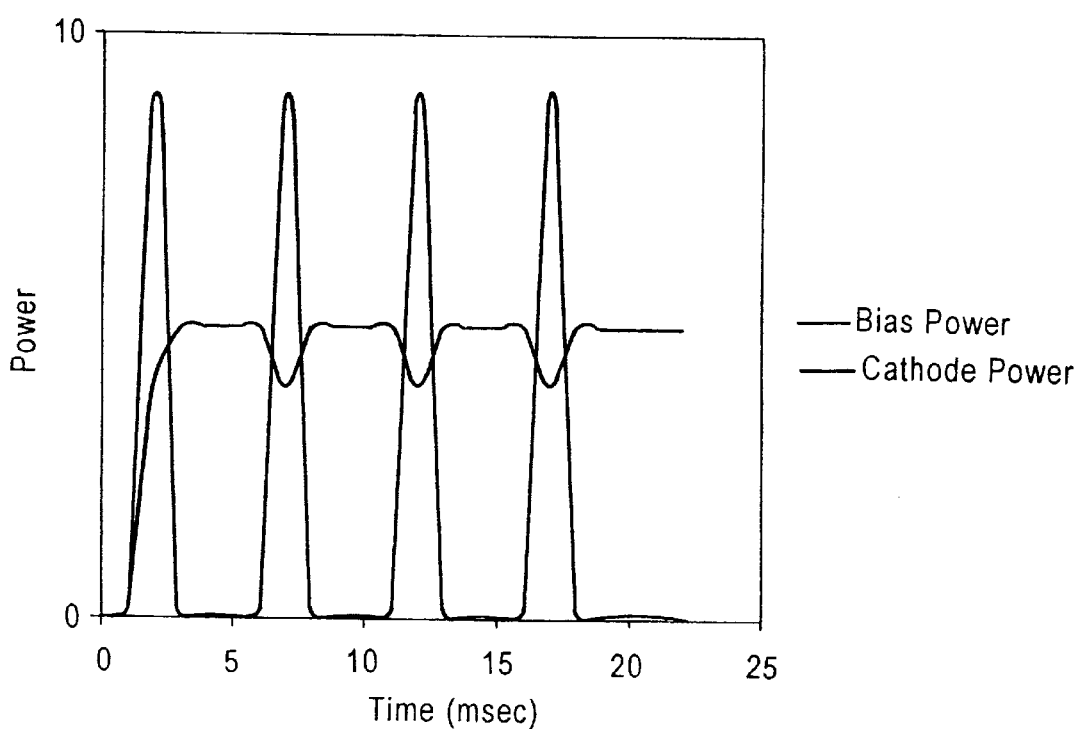

According to the invention, depending upon the nature of the film being deposited at a particular deposition station, the substrate bias can be maintained at a constant level of power at either positive or negative polarity (e.g., −300 VDC), or varied (i.e., pulsed) from a first voltage or power level and/or polarity applied when the respective cathode/target assembly receives negative polarity sputtering power pulses from the associated sputtering power source 4+intermittent sputtering controller 5 (or equivalent), for example, −200 VDC, to a second, different voltage or power level and or polarity during intervals when the negative polarity sputtering power pulses are not being supplied to the target/cathode assembly, e.g., −400 VDC. FIGS. 3–4 illustrate examples of power vs. time profiles according to the latter alternative, wherein FIG. 3 shows an increase in applied substrate bias power during negative polarity cathode/target pulsing and FIG. 4 shows a decrease in applied substrate bias power during negative polarity cathode/target pulsing.

The inventive methodology is broadly applicable to sputtering apparatus utilizing all types sputtering cathode/target assemblies, including, inter alia, planar and cylindrical magnetrons, S-guns, and non-magnetically enhanced targets. For automated manufacture of magnetic recording media, wherein deposited layer thicknesses are in the range from about 10 to greater than about 1,000 Å, negative polarity sputtering power pulses of about 4× normal can be applied, i.e., about 100 watts/in$^2$ in the static substrate deposition mode and about 50 watts/in$^2$ in the dynamic (i.e., moving) substrate mode wherein the substrate moves past the cathodes at a conventional line speed of from about 10 to about 50 fpm.

Accordingly, in view of the foregoing, the present invention provides a number of advantages over conventional automated processing for the deposition of high purity thin film layers and layer stacks, such as, for example, utilized in the manufacture of magnetic recording media. More specifically, the inventive methodology provides, inter alia, formation of high purity thin film layers while utilizing conventional manufacturing apparatus, maintains product throughput for economic competitiveness, and affords an additional degree of control of deposited film properties. Finally, the inventive methodology enjoys full compatibility with all other aspects of automated magnetic media manufacture and the inventive concept is broadly applicable to sputtering processing for the manufacture of a variety of different products, e.g., coated architectural glass and optical coatings.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A method of manufacturing a magnetic recording medium comprising a substrate and a layer stack comprising a plurality of layers formed on a deposition surface of said substrate, said layer stack including, in order from said substrate deposition surface, a polycrystalline underlayer, a magnetic recording layer, and a proctective overcoat layer, which method comprised steps of:

(a) providing a said substrate including a said deposition surface;

(b) providing at least first, second, and third cathodes including target sputtering surfaces respectively comprised of first, second, and third target materials for forming said layer stack on said substrate deposition surface; and (c) successively sputter depositing layers of said at least first, second, and third target materials over said substrate deposition surface to form said layer stack, each of said at least first, second, and third target materials being sputtered at a high rate by applying a plurality of negative voltage pulses to the respective cathode while simultaneously applying a bias voltage to the substrate, said sputter depositing including applying to each of said at least said first, second, and third cathodes a sufficient number of negative voltage pulses of sufficient power to perform high rate deposition of a desired thickness of each of said layers.

2. The method as in claim 1, wherein:

step (c) comprises maintaining said substrate static during each successive sputter deposition, with the target sputtering surface of the respective cathode facing said substrate deposition surface with a space therebetween.

3. The method as in claim 2, wherein:

step (c) comprises applying positive or negative bias voltage pulses to said substrate.

4. The method as in claim 2, wherein:

step (c) comprises applying to said substrate first bias voltage pulses during said applying of said negative voltage pulses to the respective cathode and applying to said substrate second, different bias voltage pulses during intervals when said negative voltage pulses are not applied to the respective cathode.

5. The method as in claim 4, wherein:

step (c) comprises applying to the respective substrate first and second bias voltage pulses which differ in voltage and/or polarity.

6. The method as in claim 1, wherein:

step (a) comprises providing a disk-shaped substrate.

7. The method as in claim 1, wherein:

step (a) comprises providing a substrate wherein said deposition surface thereof moves sequentially past each target sputtering surface; and step (c) comprises applying to each cathode a sufficient number of negative voltage pulses of sufficient power to sputter deposit a layer of desired thickness on said substrate deposition surface during the interval when said substrate deposition surface moves past the respective target sputtering surface.

8. The method as in claim 7, wherein:

step (c) comprises applying positive or negative bias voltage pulses to said substrate.

9. The method as in claim 6, wherein:

step (c) comprises applying to said substrate first bias voltage pulses during said applying of negative voltage pulses to said cathode and applying to said substrate second, different bias voltage pulses during intervals when said negative voltage pulses ate not applied to said cathode.

10. The method as in claim 9, wherein:

step (c) comprises applying to said substrate first and second bias voltage pulses which differ in voltage and/or polarity.

11. A method of sputter depositing on a substrate surface a magnetic recording medium comprised of a stacked plurality of layers of different materials, comprising:

(a) providing a substrate having a deposition surface; and (b) sputter depositing said stacked plurality of layers of different materials on said substrate deposition surface utilizing a sputter deposition apparatus including a plurality of sputtering targets respectively corresponding to the different materials of said stacked plurality of layers, said sputter deposition apparatus including means for applying to each of said plurality of sputtering targets a sufficient number of negative voltage pulses of sufficient power to perform high rate deposition of each of said layers on said substrate at a desired thickness while simultaneously applying a bias voltage to said substrate.

12. The method as in claim 11, wherein:

step (a) comprises providing a disk-shaped substrate.

* * * * *